United States Patent
Wang

(10) Patent No.: US 7,728,234 B2
(45) Date of Patent: Jun. 1, 2010

(54) CORELESS THIN SUBSTRATE WITH EMBEDDED CIRCUITS IN DIELECTRIC LAYERS AND METHOD FOR MANUFACTURING THE SAME

(75) Inventor: Chien-Hao Wang, Hsinchu County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 771 days.

(21) Appl. No.: 11/610,309

(22) Filed: Dec. 13, 2006

(65) Prior Publication Data

US 2007/0227763 A1 Oct. 4, 2007

(30) Foreign Application Priority Data

Mar. 31, 2006 (TW) .............................. 95111566 A

(51) Int. Cl.
*H01R 12/04* (2006.01)
*H05K 1/11* (2006.01)
(52) U.S. Cl. ...................................... 174/262; 361/792
(58) Field of Classification Search ......... 361/792–795; 174/262–266
See application file for complete search history.

(56) References Cited

U.S. PATENT DOCUMENTS 6,465,742 B1 * 10/2002 Hiraoka et al. .............. 174/255

FOREIGN PATENT DOCUMENTS

TW 585016 4/2004
TW I236324 7/2005

* cited by examiner

*Primary Examiner*—Jeremy C Norris
(74) *Attorney, Agent, or Firm*—J.C. Patents

(57) ABSTRACT

A coreless thin substrate with embedded circuits in dielectric layers is provided. The substrate includes a plurality of first patterned dielectric layers with embedded circuits, and at least a second patterned dielectric layer with embedded conducting elements. The second patterned dielectric layer is disposed between the first patterned dielectric layers, such that the embedded conducting elements electrically conduct the circuits of the first patterned dielectric layers through thermal lamination. Thus, a conventional through-hole formation process after the thermal lamination is skipped, and the substrate has a thinner and flatter profile. In one embodiment, the first patterned dielectric layers are inkjet printed layers with negative images. Moreover, the embedded circuits are flush with and exposed from an upper surface and a lower surface of the corresponding first dielectric layers.

15 Claims, 5 Drawing Sheets

CORELESS THIN SUBSTRATE WITH EMBEDDED CIRCUITS IN DIELECTRIC LAYERS AND METHOD FOR MANUFACTURING THE SAME

CROSS-REFERENCE TO RELATED APPLICATION

This application claims the priority benefit of Taiwan application serial no. 95111566, filed on Mar. 31, 2006. All disclosure of the Taiwan application is incorporated herein by reference.

BACKGROUND OF THE INVENTION

1. Field of Invention

The present invention relates to a multi-layer circuit board. More particularly, the present invention relates to a coreless thin substrate with embedded circuits in dielectric layers and a method for manufacturing the same.

2. Description of Related Art

Multi-layer circuit boards are used in various electronic products for the connection of electrical signal transmission, power supply, and grounding. With the miniaturization of the electronic products, it is required that the multi-layer circuit boards become thinner, and circuits on the multi-layer circuit boards become denser. Generally, the multi-layer circuit boards are classified into lamination circuit board and build-up circuit board according to the manufacturing processes.

In the lamination process, a plurality of circuit boards formed with a core layer and surface circuit layers are combined to a multi-layer circuit board through a thermal lamination step, and an insulating layer that is not completely polymerized is disposed between the circuit boards. In the build-up process, a circuit board including a core layer and surface circuit layers is printed layer by layer to form insulating layers and electroplated to form circuit layers. Both the lamination process and the build-up process need a circuit board including a core layer as a base unit for lamination or a carrier for build-up, so the multi-layer circuit board has a great thickness. Moreover, as the surface of the core layer is not planar, the circuit layer formed on the core layer is also not planar. And after multiple layers of the core layer, the insulating layers, and the circuit layers are formed layer by layer, the thickness of the multi-layer circuit board cannot be controlled, and the surface of the multi-layer circuit board is not planar.

Taiwan Patent No. I236324 entitled "Insulating Layer Structure of Circuit Board and Method for Forming Circuit Board Using the Insulating Layer" has disclosed relevant laminated multi-layer circuit boards and build-up circuit boards. Moreover, Taiwan Patent Publication No. 585016 entitled "Build-Up Process of Multi-Layer Printed Circuit Board and Structure thereof" has disclosed a multi-layer printed circuit board fabricated with a mixture of the build-up process and the lamination process. However, in the aforementioned known multi-layer circuit board structures, a core layer is required, and the circuits are protruded from the surface of the core layer, which are disadvantageous to the flattening and planarization of the circuit board.

FIG. 1 is a schematic sectional view of a conventional laminated multi-layer circuit board. The multi-layer circuit board 100 is formed by a plurality of core substrates 110 through thermal lamination, and an insulating layer 120 is disposed between the core substrates 110. Each of the core substrates 110 includes a core layer 111 and a plurality of circuit layers 112, 113 protruding from an upper surface and a lower surface of the core layer 111 respectively. In a core substrate 110, the circuit layers 112, 113 of the same core substrate 110 are electrically connected via a conducting hole 114. During the thermal lamination, the insulating layer 120 is a layer of incompletely polymerized material (i.e., Stage B), so as to bond the core substrates 110, and the insulating layer 120 flows to fill the gaps among the inner circuit layers 112, 113 and the conducting holes 114. However, the thickness of the insulating layer 120 for electrically insulating different core substrates 110 cannot be controlled. In addition, the conventional thermal lamination process merely achieves the mechanical bonding of different core substrates 110. After the thermal lamination, different core substrates 110 are not electrically connected, and subsequent through-hole formation process is required to form an appropriate through hole 130, which penetrates the core substrates 110 and the insulating layer 120. Moreover, a metal layer is electroplated in the through hole 130, so as to electrically connect the core substrates 110. Finally, a solder mask 140 is formed on each of the outside surfaces of the core substrates 110, so as to form the multi-layer circuit board 100. As the manufacturing flow of the conventional laminated multi-layer circuit board 100 is complicated, the manufacturing cost is high, and the thickness of the circuit board 100 is great.

SUMMARY OF THE INVENTION

The present invention is directed to providing a coreless thin substrate with embedded circuits in dielectric layers and a method for manufacturing the same. The substrate comprises a plurality of first patterned dielectric layers with a plurality of embedded circuits, and at least a second patterned dielectric layer with a plurality of embedded conducting elements. The second patterned dielectric layer is disposed between the first patterned dielectric layers, such that the embedded conducting elements electrically conduct the circuits of the first patterned dielectric layers through thermal lamination. Thus, a conventional through-hole formation process after the thermal lamination is skipped, and the substrate has a thinner and flatter profile.

The present invention is further directed to providing a careless thin substrate with embedded circuits in dielectric layers, a method for manufacturing the same, and a structure of embedded circuits. The first patterned dielectric layers are inkjet printed layers of negative images. The images of the patterns of the first patterned dielectric layers are opposite to the circuits on the same layer, such that the circuits are embedded in the first patterned dielectric layers; and a thickness of the first patterned dielectric layers is the same as a thickness of the circuits embedded in the first patterned dielectric layers, such that the circuits are flush with and exposed from an upper surface and a lower surface of the first patterned dielectric layers, so as to electrically connect the circuits and the embedded conducting elements during the thermal lamination without the complicated substrate process using the conventional core layers.

According to the present invention, a coreless thin substrate with embedded circuits in dielectric layers mainly comprises a plurality of first patterned dielectric layers with embedded circuits, and at least a second patterned dielectric layer with embedded conducting elements. The second patterned dielectric layer is disposed between the first patterned dielectric layers, and the circuits of the first patterned dielectric layers are electrically conducted with the embedded conducting elements through the thermal lamination. Thus, the conventional through-hole process after the thermal lamination is skipped, and a thinner and flatter substrate is obtained.

DESCRIPTION OF EMBODIMENTS

Figure 1:
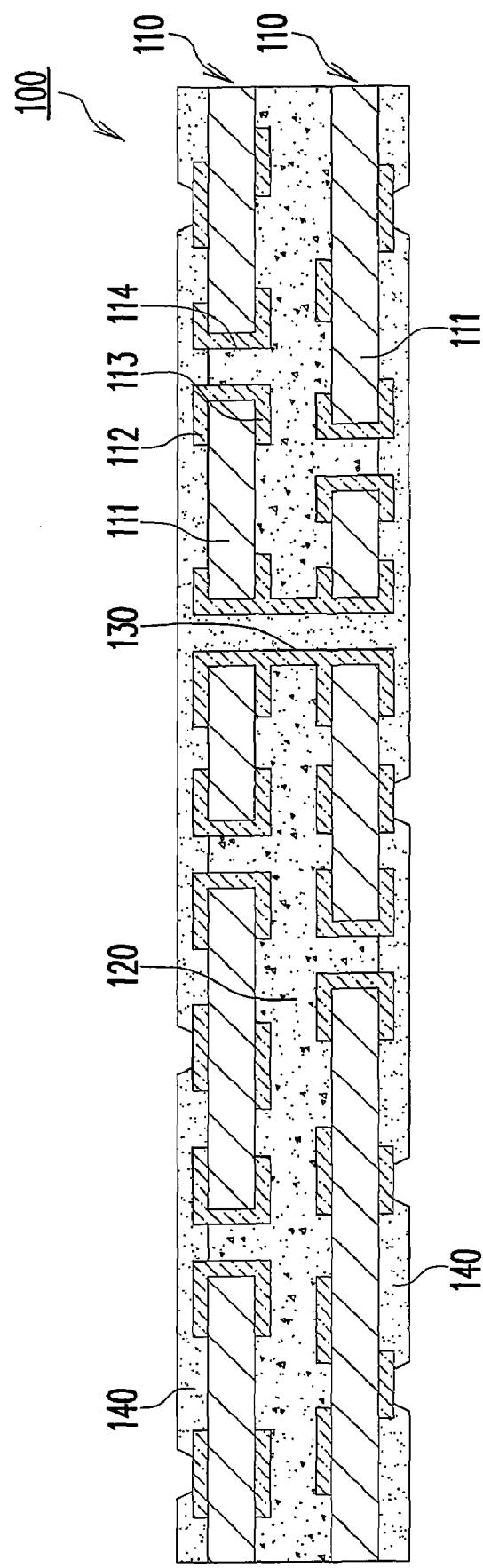
FIG. 1 is a schematic sectional view of a conventional laminated multi-layer circuit board.
Figure 2:
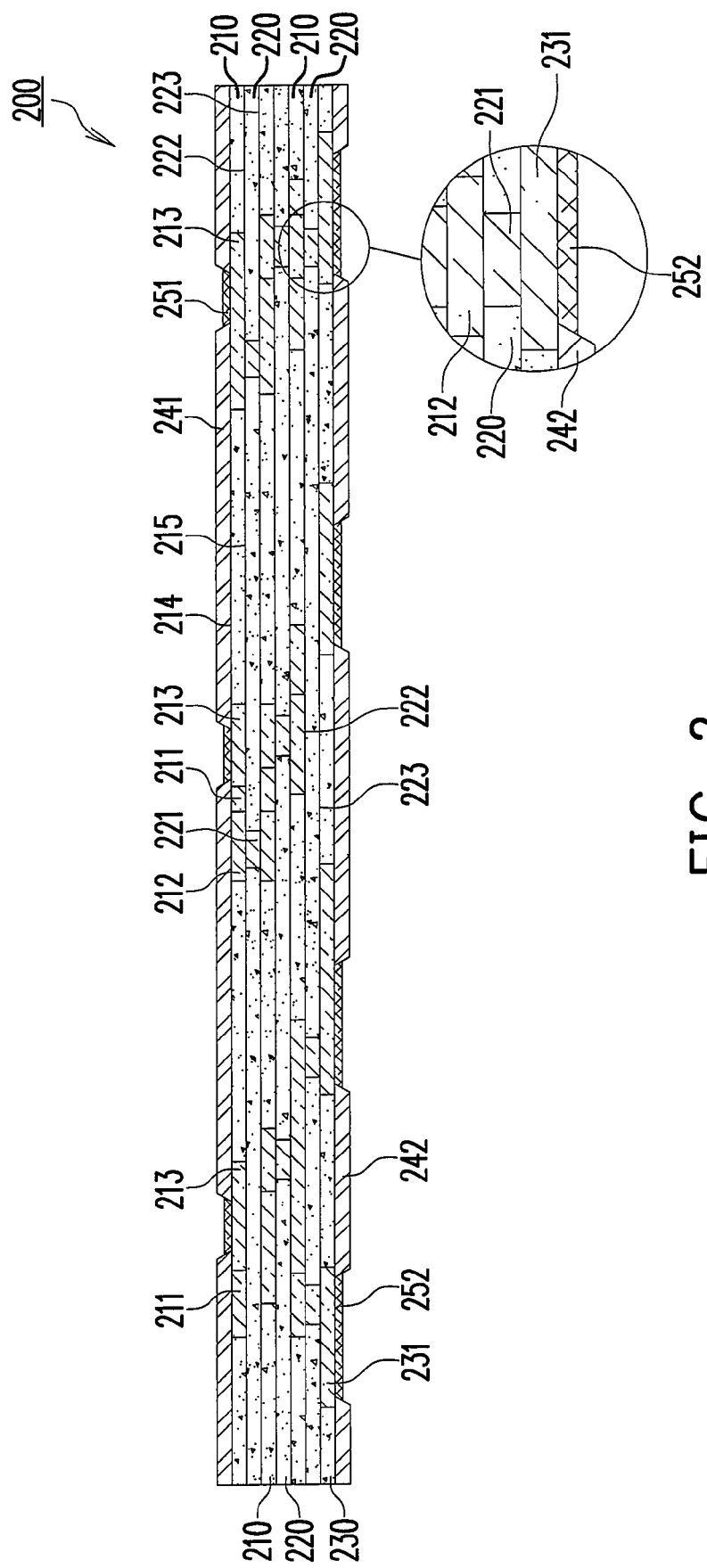
FIG. 2 is a schematic sectional view of a coreless thin substrate with embedded circuits in dielectric layers according to a specific embodiment of the present invention.

An embodiment of the present invention is illustrated as follows. As shown in FIG. 2, a coreless thin substrate with embedded circuits in dielectric layers 200 mainly includes a plurality of first patterned dielectric layers 210 and at least a second patterned dielectric layer 220. The second patterned dielectric layer 220 is disposed between the first patterned dielectric layers 210.

A plurality of circuits 211 is embedded in each of the first patterned dielectric layers 210. The circuits 211 are connected to a plurality of interconnection pads 212, which is also embedded in the first patterned dielectric layers 210. In addition, a plurality of first external connection pads 213 for connecting the circuits 211 is embedded in the outermost first patterned dielectric layer 210. As the circuits 211, the interconnection pads 212, and the first external connection pads 213 are embedded in the first patterned dielectric layers 210, the first patterned dielectric layers 210 have a flatter upper surface 214 and a flatter lower surface 215. To form the embedded circuits 211 precisely, preferably, the first patterned dielectric layers 210 are inkjet printed layers of negative images. The images of the patterns of the first patterned dielectric layers 210 are opposite to the circuits 211 on the same layer, and the material is a non-conductive ink or a non-conductive paste film that is not polymerized, such as Polyimide (PI) and Poly ethylene terephthalate (PET), and preferably the material has To multi-stage curing characteristics. The circuits 211, the interconnection pads 212, and the first external connection pads 213 are an inkjet printed layer of positive images. The material is a conductive ink, which is composed by high-con-tent fine conductive particles and a polymerizer of the resin type. Here, the conductive particles are selected from silver powder, copper powder, carbon powder, or other conductive polymers, etc. The thickness of the first patterned dielectric layers 210 is the same as the thickness of the circuits 211, the interconnection pads 212, and the first external connection pads 213 embedded in the first patterned dielectric layers 210, i.e., about 8-50 μm, such that the circuits 211, the interconnection pads 212, and the first external connection pads 213 are flush with and exposed from the upper surface 214 and the lower surface 215 of the first patterned dielectric layers 210 (shown as an exposed surface 216 in FIG. 3C), so as to facilitate the electrical connection of the upper and lower layers.

A plurality of conducting elements 221 is embedded in the second patterned dielectric layer 220, and the embedded conducting elements 221 electrically conduct the circuits 211 of the first patterned dielectric layers 210. The embedded conducting elements 221 are selected from the group consisting of conductive plugs, plated through holes, and internal connection pads. If the plated through holes are used, it is preferred that the gaps are filled with the conductive ink. The embedded conducting elements 221 are flush with and exposed from an upper surface 222 and a lower surface 223 of the second patterned dielectric layer 220. The material of the embedded conducting elements 221 is a conductive ink or a conductive metal. In this embodiment, the embedded conducting elements 221 are embedded, and other circuits (not shown) can also be embedded in the second patterned dielectric layer 220. However, these circuits are not connected, interlaced, or overlapped with the circuits 211 of the first patterned dielectric layers 210, so as to prevent the short, circuit. Preferably, the second patterned dielectric layer 220 is an inkjet printed layer of negative images, so as to precisely define the positions and size of the embedded conducting elements 221, such that the embedded conducting elements 221 align with the interconnection pads 212 or the first external connection pads 213 of the first patterned dielectric layers 210. The second patterned dielectric film 220 can be a non-conductive ink or non-conductive paste film (NCP or NCF). Preferably, the second patterned dielectric layer 220 is a non-conductive paste film, and the cure shrinkage property of the non-conductive paste film improves the electrical contact of the embedded conducting elements 221 and the interconnection pads 212 or the first external connection pads 213 corresponding to the first patterned dielectric layers 210.

The coreless thin substrate 200 can further include a first solder mask 241 formed on the outermost first patterned dielectric layer 210 and at least partially exposing the first external connection pads 213, and a first electroplated layer 251 formed on an exposed surface of the first external connection pads 213. Preferably, the coreless thin substrate 200 can further include a third patterned dielectric layer 230 disposed on an outer side of the second patterned dielectric layer 220. A plurality of second external connection pads 231 is embedded in the third patterned dielectric layer 230. A second solder mask 242 is formed on the third patterned dielectric layer 230, and at least partially exposes the second external connection pads 231. A second electroplated layer 252 is formed on the exposed surface of the second external connection pads 231.

Therefore, the coreless thin substrate 200 does not need core layers, and has no protruding circuits, and thus has a thinner and flatter profile. In addition, compared with conventional laminated multi-layer circuit boards, the coreless thin substrate 200 realizes the mechanical bonding and the electrical conduction of upper and lower layers during the thermal lamination, and the through-hole formation process after the thermal lamination is not required. Thus, the process is simplified, the manufacturing cost is lowered, and more space and flexibility is allowed in the layout and design of the circuits.

The method for manufacturing the coreless thin substrate 200 is illustrated as follows.

Figure 3A:
FIGS. 3A-3C are schematic sectional views of one of the first patterned dielectric layers with embedded circuits in the inkjet printing process of the coreless thin substrate according to a specific embodiment of the present invention.
Figure 3B:
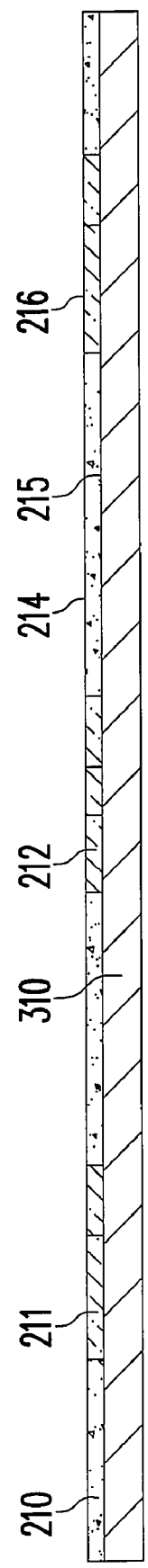
Figure 3C:
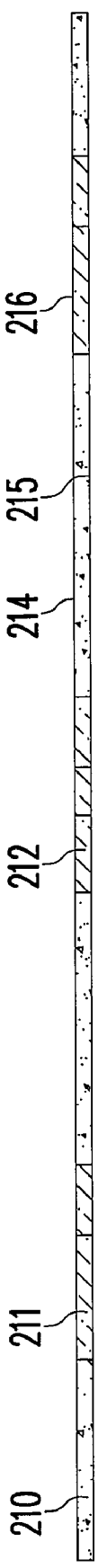

As shown in FIG. 3A, a first patterned dielectric layer 210 is formed on a carrier 310 by means of inkjet printing. The first patterned dielectric layer 210 is an inkjet printed layer of negative images, and the carrier 310 is preferably a thermal release film to facilitate the peeling in subsequent processes. During the inkjet printing, the first patterned dielectric layer 210 can be coated as a liquid in Stage A, and then the first patterned dielectric layer 210 is pre-baked to realize partial polymerization, such that the first patterned dielectric layer 210 has Stage B characteristics. As shown in FIG. 3B, a plurality of circuits 211 is formed by means of inkjet printing. The circuits 211 are an inkjet printed layer of positive images, and are embedded in gaps of the first patterned dielectric layer 210. Then, as shown in FIG. 3C, the carrier 310 is removed to form the first patterned dielectric layer 210 with embedded circuits 211. Therefore, patterned dielectric layers with various circuits can be manufactured through the aforementioned process.

Figure 4A:
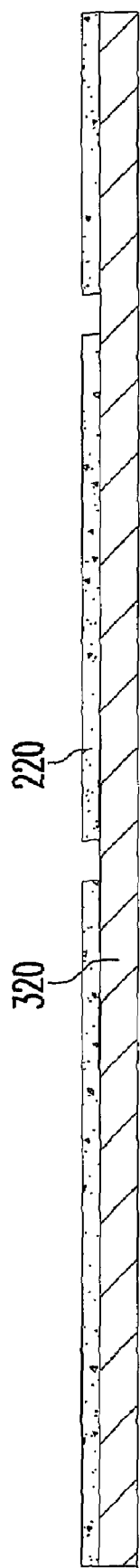
FIGS. 4A-4B are schematic sectional views of one of the second patterned dielectric layers with embedded conducting elements in the forming process of the coreless thin substrate according to a specific embodiment of the present invention.
Figure 4B:

As shown in FIG. 4A, a second patterned dielectric layer 220 is formed on another carrier 320 by means of inkjet printing. The second patterned dielectric layer 220 is an inkjet printed layer of negative images. As shown in FIG. 4B, a plurality of embedded conducting elements 221 is formed in the gaps of the second patterned dielectric layer 220. Then, the carrier 320 is removed to form the second patterned dielectric layer 220 with the embedded conducting elements 221.

Figure 5A:
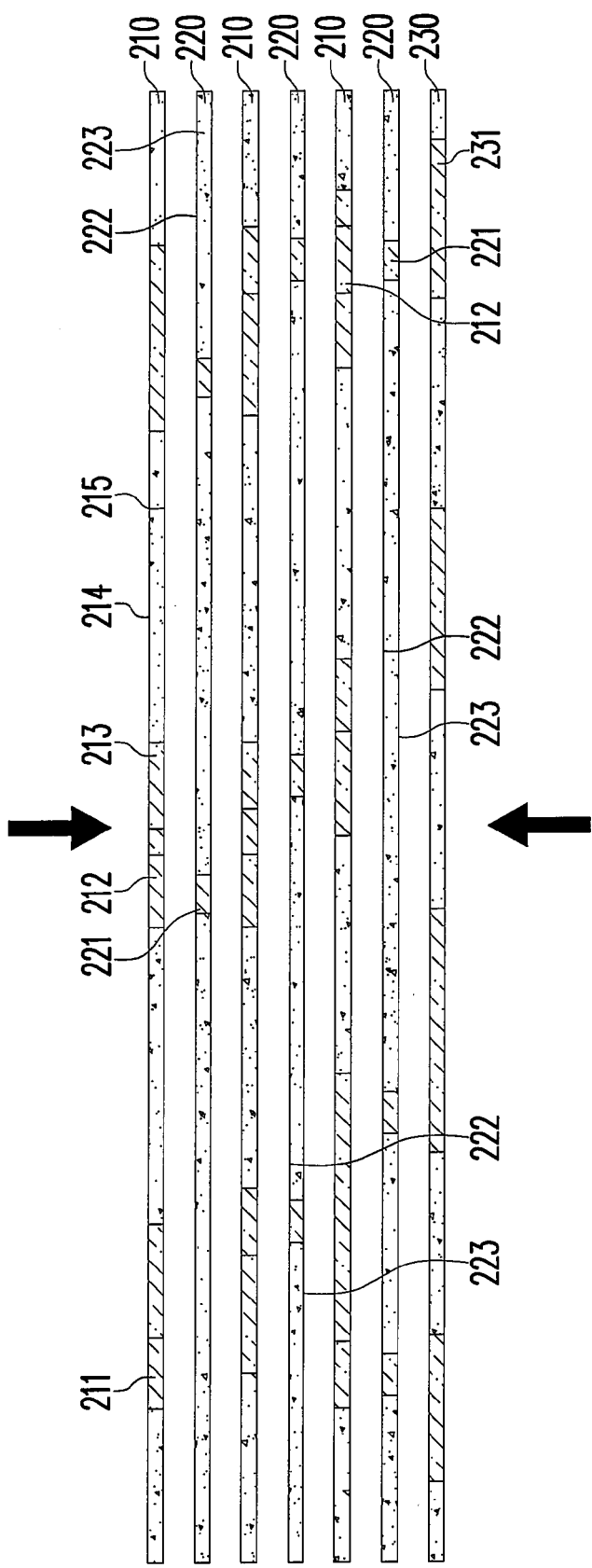
FIGS. 5A-5B are schematic sectional views of the coreless thin substrate in the thermal lamination process according to a specific embodiment of the present invention.
Figure 5B:
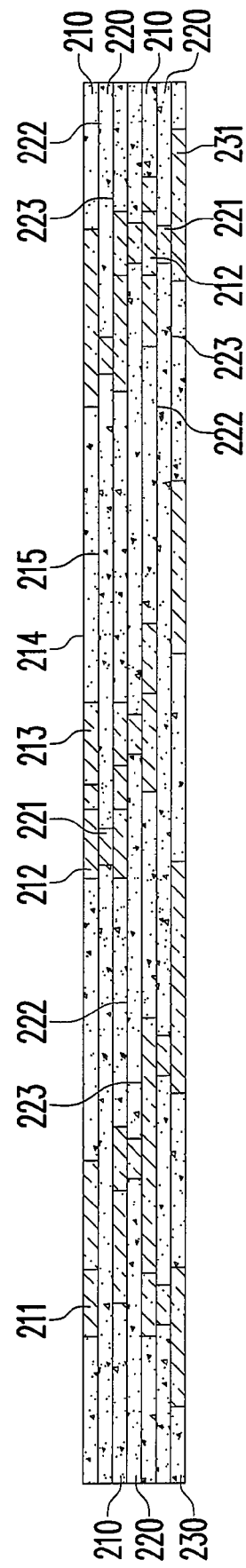

As shown in FIG. 5A, the first patterned dielectric layers 210 and the second patterned dielectric layer 220 are thermal laminated in a heated and pressurized operation, and the second patterned dielectric layer 220 is disposed between the first patterned dielectric layers 210 during the thermal lamination. As shown in FIG. 5B, the first patterned dielectric layers 210 and the second patterned dielectric layer 220 are completely polymerized. The circuits 211 of the first patterned dielectric layers 210 are electrically conducted with the embedded conducting elements 221. Finally, the solder masks 241, 242 and the electroplated layers 251, 252 are formed, thus manufacturing the coreless thin substrate 200.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A coreless thin substrate with embedded circuits in dielectric layers, comprising:
   a plurality of first patterned dielectric layers, having a plurality of embedded circuits; and
   at least a patterned dielectric layer, having a plurality of embedded conducting elements;
   wherein the second patterned dielectric layer is disposed between the first patterned dielectric layers, and the embedded conducting elements of the second patterned dielectric layer are electrically conducted with the embedded circuits of the first patterned dielectric layers, wherein a plurality of external connection pads connecting the embedded circuits are further embedded in an outermost layer of the first patterned dielectric layers, and a solder mask is formed on the outermost layer of the first patterned dielectric layers and at least partially exposes the external connection pads.

2. The coreless thin substrate with embedded circuits in dielectric layers as claimed in claim 1, wherein the first patterned dielectric layers and the second patterned dielectric layer are bonded through thermal lamination.

3. The coreless thin substrate with embedded circuits in dielectric layers as claimed in claim 1, wherein the first patterned dielectric layers are an inkjet printed layer.

4. The coreless thin substrate with embedded circuits in dielectric layers as claimed in claim 3, wherein the inkjet printed layer is an inkjet printed layer of negative images.

5. The coreless thin substrate with embedded circuits in dielectric layers as claimed in claim 1, wherein the embedded circuits are an inkjet printed layer.

6. The coreless thin substrate with embedded circuits in dielectric layers as claimed in claim 5, wherein the embedded circuits are an inkjet printed layer of positive images.

7. The coreless thin substrate with embedded circuits in dielectric layers as claimed in claim 1, wherein the second patterned dielectric layer is an inkjet printed layer.

8. The coreless thin substrate with embedded circuits in dielectric layers as claimed in claim 1, wherein a thickness of the first patterned dielectric layers is the same as a thickness of the corresponding embedded circuits.

9. The coreless thin substrate with embedded circuits in dielectric layers as claimed in claim 8, wherein the embedded circuits are flush with and exposed from an upper surface and a lower surface of the first patterned dielectric layers.

10. The coreless thin substrate with embedded circuits in dielectric layers as claimed in claim 9, wherein the embedded conducting elements are flush with and exposed from an upper surface and a lower surface of the second patterned dielectric layer.

11. The coreless thin substrate with embedded circuits in dielectric layers as claimed in claim 1, wherein the second patterned dielectric layer is a non-conductive paste film.

12. The coreless thin substrate with embedded circuits in dielectric layers as claimed in claim 1, wherein the conducting elements are one selected from the group consisting of conductive plugs, plated through holes, and internal connection pads.

13. The coreless thin substrate with embedded circuits in dielectric layers as claimed in claim 1, further comprising an electroplated layer formed on the external connection pads.

14. A coreless thin substrate with embedded circuits in dielectric layers, comprising:
   a plurality of first patterned dielectric layers, having a plurality of embedded circuits; and
   at least a patterned dielectric layer, having a plurality of embedded conducting elements;
   wherein the second patterned dielectric layer is disposed between the first patterned dielectric layers, and the embedded conducting elements of the second patterned dielectric layer are electrically conducted with the embedded circuits of the first patterned dielectric layers, wherein a third patterned dielectric layer is disposed on an outer side of the second patterned dielectric layer and has a plurality of embedded external connection pads, and a solder mask is formed on the third patterned dielectric layer and at least partially exposes the external connection pads.

15. The coreless thin substrate with embedded circuits in dielectric layers as claimed in claim 14, further comprising an electroplated layer formed on the external connection pads.

* * * * *